United States Patent [19]

Lonis et al.

[11] Patent Number: 4,737,798

[45] Date of Patent: Apr. 12, 1988

[54] LASER DIODE MODE HOPPING SENSING AND CONTROL SYSTEM

[75] Inventors: Robert A. Lonis, Williamson; Norman E. Wright, Rochester, both of N.Y.

[73] Assignee: Xerox Corporation, Stamford, Conn.

[21] Appl. No.: 882,122

[22] Filed: Jul. 3, 1986

[51] Int. Cl.$^4$ .................. G01D 9/42; H01S 3/04
[52] U.S. Cl. ................... 346/1.1; 346/108; 372/19; 372/29; 372/24; 372/34
[58] Field of Search .............. 346/108, 107 R, 76 L, 346/1.1, 160; 358/296; 372/29, 33, 34, 32, 24, 19

[56] References Cited

U.S. PATENT DOCUMENTS

| | | | |
|---|---|---|---|
| 3,588,254 | 6/1971 | Rhoades | 356/106 |
| 3,588,738 | 6/1971 | Goodwin | 331/94.5 |
| 3,790,901 | 2/1974 | White et al. | 331/94.5 |
| 3,902,135 | 8/1975 | Terada et al. | 331/94.5 S |
| 4,103,254 | 7/1978 | Chikami | 331/94.5 S |
| 4,309,671 | 1/1982 | Malyon | 331/94.5 S |
| 4,428,643 | 1/1984 | Kay | 350/3.71 |
| 4,625,315 | 11/1986 | Lemberger | 372/31 |
| 4,683,573 | 7/1987 | Albanese | 372/34 |

OTHER PUBLICATIONS

Wang et al.; "Measurement & Control of Subangstrom Mirror Displacement by Acousto-Optical Technique"; Rev. Sci., Instrum; 53(7); Jul. 1982; pp. 963–966.
Wittke et al.; "Stabilization of CW-Injection Lasers"; RCA Technical Notes; TN No. 1005; Apr. 9, 1975.

*Primary Examiner*—Clifford C. Shaw
*Assistant Examiner*—Mark Reinhart
*Attorney, Agent, or Firm*—Frederick E. McMullen

[57] ABSTRACT

A printer having holographic scanning disc for scanning the imaging beam from a laser diode across a recording member, the diode having diode biasing and modulating current inputs for modulating the diode and thereby exposing and creating images on the recording member, a heating-cooling device in heat exchange relation with the diode for controlling diode temperatures, and a current sensor for monitoring the diode biasing and modulating currents and operating the heating-cooling device to adjust diode temperatures to maintain diode temperatures within a non-mode hopping temperature range.

5 Claims, 5 Drawing Sheets

LASER DIODE MODE HOPPING SENSING AND CONTROL SYSTEM

The invention relates to raster output scanners with laser diode and holographic scanning disc, and more particularly, to a method and apparatus for sensing and controlling laser diode mode hopping.

As the technology of raster output scanners, often referred to as ROS's, evolves, one major improvement of interest involves replacement of the scanning polygon and the relatively complex cylindrical correction optics normally associated therewith with a holographic scanning system. In that type of scanning system, a holographic disc having a succession of grating facets about the periphery thereof is used in place of a polygon to raster scan the imaging beam across a recording member. A further improvement commensurate with this would replace the relatively bulky gas laser and its attendant modulator with a relatively small internally modulated laser diode.

However, combining a laser diode with a holographic scanning system presents at least one major problem, i.e. the tendency of laser diodes to mode hop due to the diode's inherent frequency instability. This tendency of laser diodes is rooted in the very broad gain curve of a laser diode and their tendency to shift frequencies with changes in temperature. As a result, laser diodes, even those laser diodes normally operating as single longitudinal mode lasers shift from one longitudinal mode to another as temperature or equivalently duty cycle or power level change.

In the prior art, tuning lasers to provide a stabilized laser frequency are known as evidenced by U.S. Pat. No. 4,103,254 (Chikami) wherein detectors are used to sense laser beam energy sharing, by U.S. Pat. No. 3,588,738 (Goodwin) wherein the laser output beam is split to permit amplitude comparison for use in controlling a frequency adjusting element, and by U.S. Pat. No. 3,588,254 (Rhoades) wherein a calibration system for adjusting laser frequency is provided using a laser heater. Additionally, U.S. Pat. No. 3,790,901 to White et al discloses a system for electro-optically producing a dual polarization laser while U.S. Pat. No. 3,902,135 to Terada et al describes a laser with adjustable mirror facet to control and stabilize laser wavelength irrespective of temperature changes.

In U.S. Pat. No. 4,309,671 (Malyon), the prior art discloses a feedback control which responds to the emission wavelength of a laser diode. In that arrangement, beam splitters impinge a portion of the laser beam onto a pair of photodiodes, the beam to one photodiode being filtered through a frequency dependent filter. The output signals from the photodiode pair are amplified and subtracted from one another to provide a feed back signal which after amplification controls a laser operating parameter such as temperature to maintain constant wavelength. Other prior art interest in this subject is found in the article "Measurement and Control of Sub-Angstrom Mirror Displacement by Acousto-Optical Technique" by C. P. Wang, R. L. Varwig, and P. J. Ackman (Rev. Sci. Instrum, 53(7), July 1982, pp 963-966) in which the importance of controlling laser frequency and mode stability through laser mirror spacing and angular orientation are discussed, and the RCA publication "Stabilization of CW Injection Lasers" by J. P. Wittke, D. R. Patterson, and I. Ladany (RCA Technical Notes, No. 1005, Apr. 9, 1975) where both the effect of laser temperature and aging on laser threshold current is discussed. In the RCA article, it is concluded that both laser drive current and operating temperature must be controlled to achieve constant laser output power and that this may be effected by using a feedback system in which an optical detector is used to sense laser beam intensity, with the signal output of the detector then compared with a reference signal to provide a control signals for a thermo-electric cooler.

In contrast, the present invention provides a method of preventing laser diode mode hopping having the steps of: identifying a stable operating temperature range for the laser diode by reducing diode biasing current until a predetermined biasing current is reached providing a first diode temperature level at which the laser diode mode hops; increasing diode modulating current until a predetermined modulating current is reached providing a second diode temperature level at which laser diode mode hops; monitoring the diode biasing and modulating currents when operating the diode; heating the diode in response to detection of the predetermined diode biasing current to raise the diode temperature and prevent the diode from reaching the first temperature level whereby to prevent the diode from mode hopping; and cooling the diode in response to detection of the predetermined diode modulating current to lower the diode temperature and prevent the diode from reaching the second temperature level whereby to prevent the diode from mode hopping.

The invention further relates to an apparatus for detecting and preventing laser diode mode hopping in a printer having a recording member on which images to be printed are formed through image-wise exposure, the recording member being movable in a first scanning direction, the laser diode having a driving current input composed of diode biasing and image signal modulating currents, light from the laser diode exposing the recording member in accordance with the image content of the modulating current, a rotatable holographic disc having a succession of defraction gratings, the disc being disposed relative to the laser diode so that the beam emitted by the laser diode impinges on the gratings in succession as the disc rotates to thereby scan the beam across the recording member in a second scanning direction; a temperature control element in heat exchange relation with the diode and selectively actuatable to either heat or cool the diode; and current sensing means for monitoring the biasing and modulating currents to the diode, the current sensing means responding on a predetermined bias current to actuate the temperature control element to raise diode temperatures and prevent diode mode hopping, the current sensing means responding to a predetermined modulating current to actuate the temperature control element to lower diode temperatures and prevent diode mode hopping.

Figure 4:
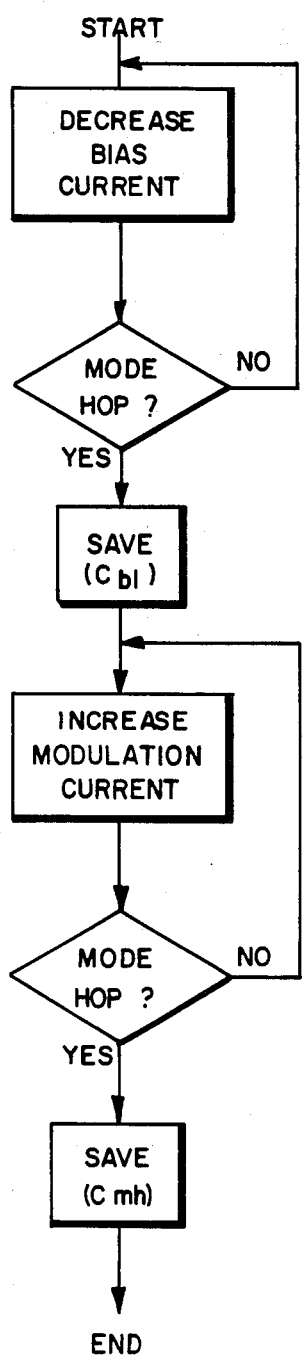
Figure 5:
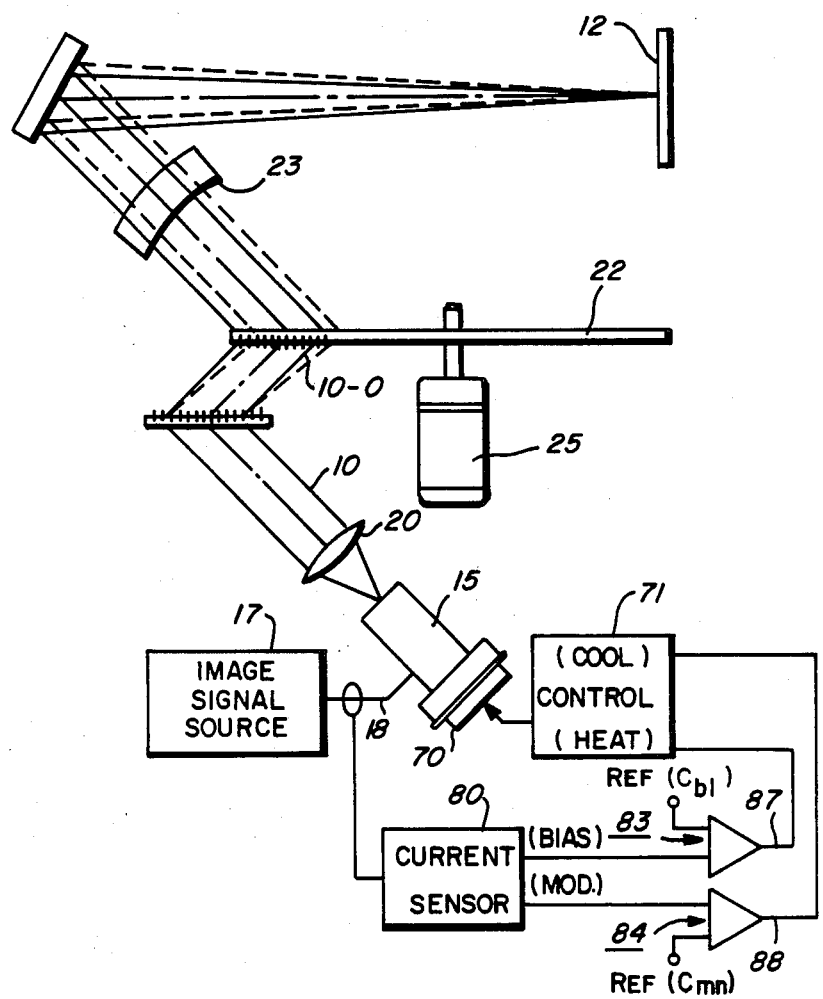

FIG. 4 is a flow chart illustrating the steps by which the bias and modulation current levels at which diode mode hopping occurs are identified in the present invention; and FIG. 5 is a schematic view showing the mode hopping control of the present invention in which laser diode bias and modulation currents are monitored to detect mode hop and provide signals for actuating a heating-cooling element to adjust diode temperatures and avoid mode hop.

Figure 1:
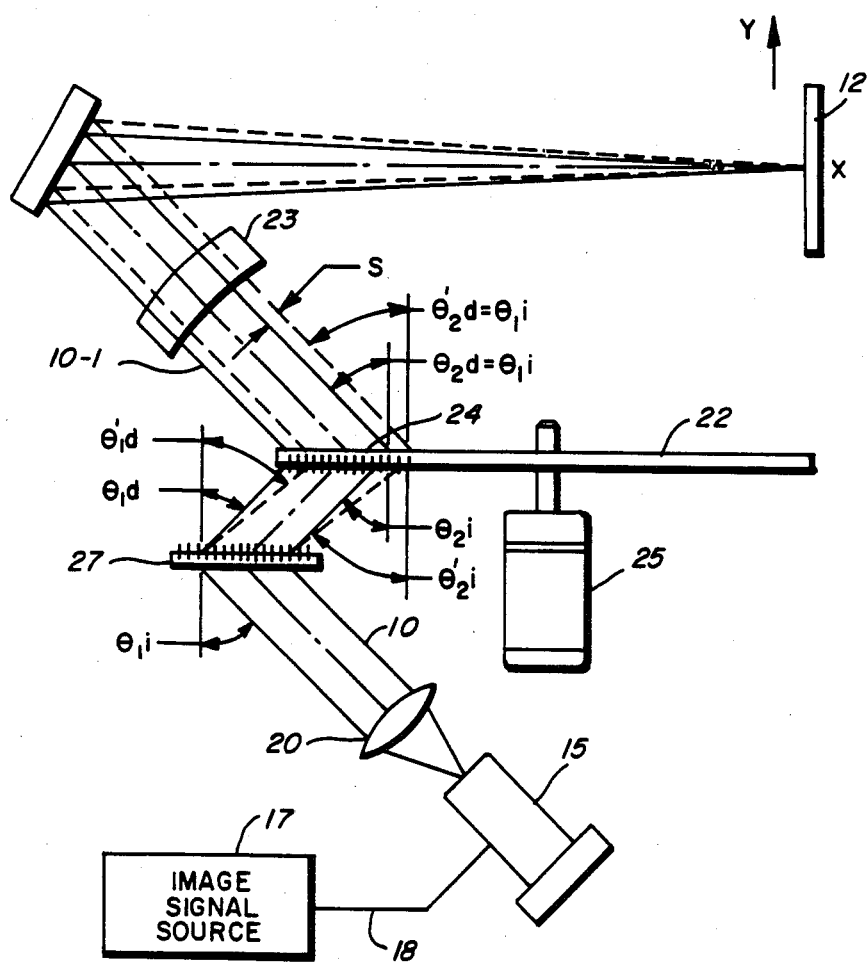
FIG. 1 is a schematic view of a prior art raster output scanner incorporating a plane linear compensating grating to nullify laser diode mode hopping in the cross scan direction.

Referring to FIG. 1 of the drawings, there is shown a Raster Output Scanner or ROS in which a high intensity laser beam 10, modulated in accordance with an image signal input, is scanned across a recording member 12 to selectively expose member 12. The image produced on the recording member 12 is thereafter developed to provide a visible image.

Recording member 12 may comprise any suitable recording medium such as the photoreceptor of a xerographic type imaging system. In systems of that type, the photoreceptor is first uniformly charged and then exposed by beam 10 to form a latent electrostatic image thereon as represented by the image signal input. The latent electrostatic image is thereafter developed and the developed image transferred to a suitable copy substrate material such as paper. Following transfer, the image is fixed as by fusing to form a permanent image. As will be understood, recording member 12 may be in any suitable form such as drum, web, belt, etc.

Beam 10 is generated by a suitable laser diode 15 which may for example comprise a Hitachi Model No. 7801E diode. An internal modulating circuit enables diode 15 to be modulated in accordance with an image signal input. The driving current for laser diode 15, which includes both bias and image signal modulation components, is input to diode 15 through line 18. As will be understood, the image signals may be obtained from any suitable source 17 such as comprise a memory, an input scanner, communication channel, character generator, etc..

The modulated beam 10 output by diode 15 passes through a suitable collimating lens 20 and a plane linear compensating grating 27 and impinges at an angle of substantially 45° on the grating facets 24 of a rotating holographic disc 22. Disc 22 has a succession of facets 24 around the periphery thereof such that on rotation of disc 22 by motor 25, a first order beam 10-1 is scanned by each facet 24 across recording member 12 in the X direction. Concurrently, recording member 12 is moved by a suitable drive means (not shown) in the Y direction (the direction shown by the solid line arrow in FIG. 1). A suitable lens 23 is provided downstream of disc 22 for focusing beam 10 to a point on recording member 12.

As described in U.S. Pat. No. 4,428,643 to Kay, grating 27 is a wavelength compensating device which has properties identical to the facet gratings formed on the surface of disc 22. In other words, if the disc facets 24 are holographically formed, grating 27 is holographically formed using the same photorecording system. Accordingly, grating 27 has the same period as the disc grating facets and consequently has the same high diffraction efficiency as disc 22. Grating 27 is placed in the tangential plane parallel to the plane of disc 22.

Assuming diode 15 is operating at its nominal wavelength, beam 10 is directed at the incident angle $\theta 1_i$ onto grating 27 and is diffracted out at diffraction angle $\theta 1_d$ (solid line path), the angles $\theta 1_i$ and $\theta 1_d$ being measured with respect to normal of the plane of the grating. Since grating 27 and disc 22 are parallel, by symmetry beam 10 is incident on the center of facet 24 at angle $\theta 2_i = \theta 1_d$. Facet 24 diffracts the beam at a diffraction angle $\theta 2_d$ which is parallel with the incident path of beam 10 at grating 27, i.e. $\theta 2_d = \theta 1_i$.

Where a shift of the wavelengths of diode 15 occurs as for example due to temperature induced mode hopping, the beam 10 is still incident on grating 27 at angle $\theta 1_i$ but is diffracted along a slightly different path, represented by the dotted line, at an angle $\theta'1_d$. (The path is chosen at an exaggerated deviation angle for illustrative purposes.) The beam is incident on facet 24 at angle $\theta'2_i$ and is diffracted out at an angle of $\theta'2_d$ and as shown above, $\theta'2_d = \theta 1_i$. The beam is, however, shifted by a lateral distance S from the position of the first beam. This small lateral displacement is of no consequence since lens 23 focuses all image rays parallel entering it into the same point on the plane of recording member 12.

Accordingly, in the FIG. 1 arrangement, the scanned line will be corrected for errors in the cross scan or Y direction by grating 27. However, errors in the fast scan or X direction are only corrected at zero scan angle, i.e. when the beam is in the center angular rotation position of gratings 24 of disc 22.

Figure 2:
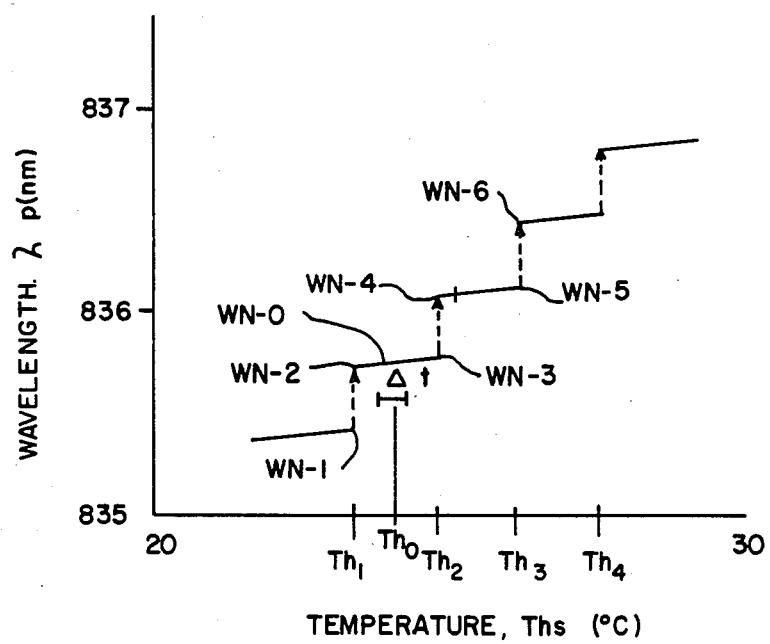
FIG. 2 is a graphical representation demonstrating the relationship between laser wavelength and temperature.

In FIG. 2 there is shown by graphical representation typical wavelength behavior of a laser diode such as diode 15 as a function of temperature. Assuming that diode 15 is initially operating in an ambient temperature condition, when the diode is modulated (assuming diode 15 is D.C. biased just below threshold) in accordance with image signal input 17, the modulation causes a temperature excursion $\Delta T$ from the ambient temperature to some higher temperature. If the temperature excursion $\Delta T$ spans a temperature $Th_1, Th_2, \ldots Th_n$ at which mode hopping takes place, then the laser will jump or mode hop to a different wavelength. For example, where the temperature excursion $\Delta T$ spans temperature $Th_2$, then a mode hop from wavelength $Wn_3$ to $Wn_4$ occurs. If the $\Delta T$ excursion however lies between two mode hopping temperatures, for example between $Th_1$ and $Th_2$, then no mode hop occurs and the beam output by laser diode 15 remains stable at a single wavelength.

Figure 3:
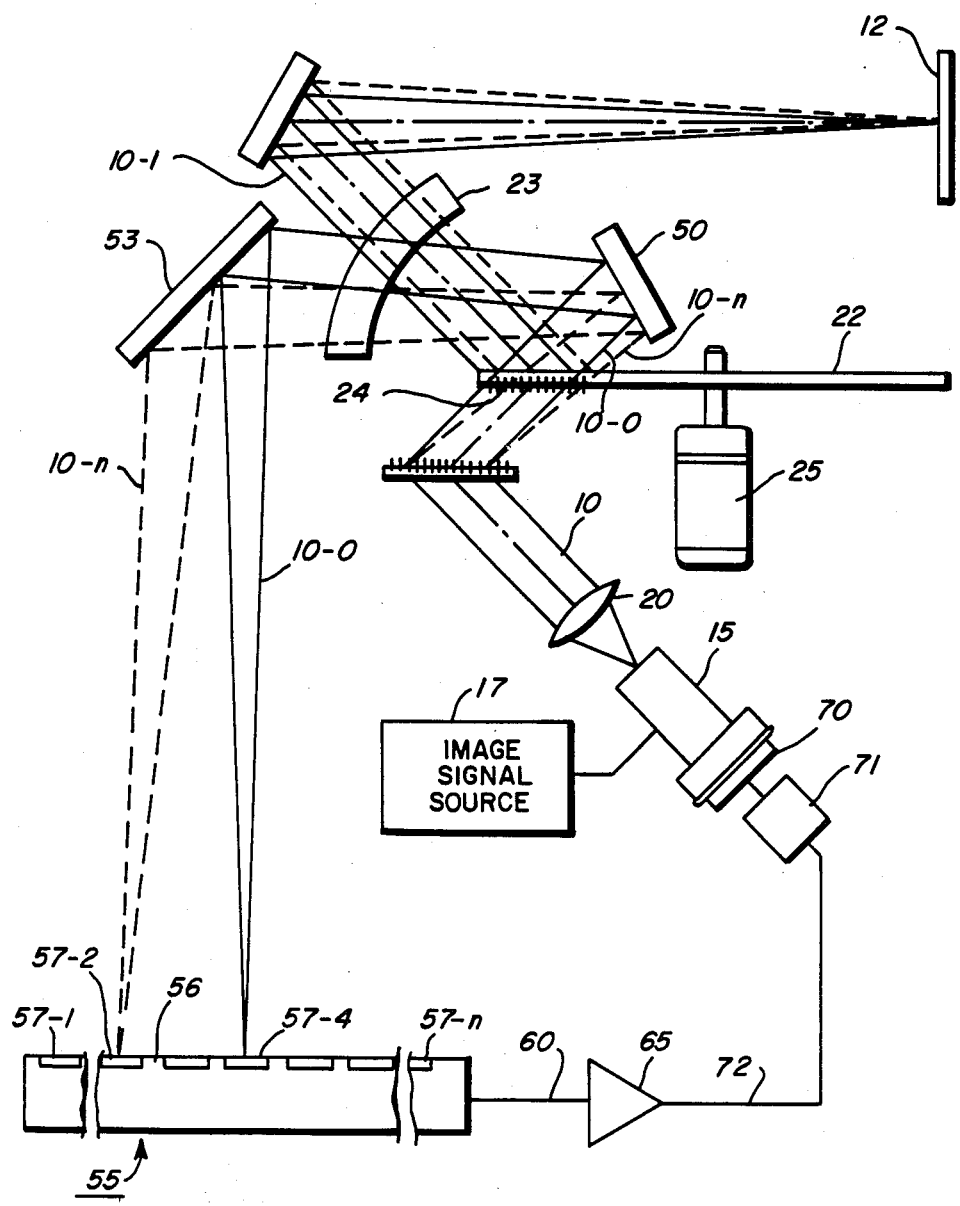
FIG. 3 is a schematic view showing a mode hopping control for raster output scanners, with beam pick-off mirrors, beam position detector, and diode temperature control element for detecting and controlling diode mode hopping.

In FIG. 3, the scanner shown in FIG. 1 is modified to detect and correct laser mode hopping. There a pick-off mirror 50 is provided to intercept the zero order or non-diffracted beam 10-0 passing through the facets 24 of disc 22 together with any shifted variant (identified herein as zero order beam 10-n) that results from a mode hop by diode 15. In this example, the first order beam 10-1 is used to expose recording member 15 while the zero order beam 10-0 is typically impinged against a beam stop. In this instance, mirror 50 takes the place of the beam stop.

The zero order beam 10-0 and any shifted beam 10-n that occurs pass through lens 23, which is enlarged for this purpose, and impinge on a second mirror 53. Mirror 53 reflects the zero order beam 10-0 and any shifted beam 10-n onto the surface 56 of a suitable beam position detector shown here as a linear sensor array 55 having a row or array of photosites in the form of photodiodes 57-1, . . . 57-n. Other detector types such as a lateral photodiode may instead be contemplated.

Lens 23 focues the zero order beam 10-0, representing the no mode hop condition of laser diode 15 onto the surface 56 of array 55 at a preset point. It will be understood that the point where beam 10-0 impinges on the surface 56 of array 55 is determined by the characteristics of the scanner optical system, particularly mirrors 50,52 and lens 23.

Any shifted beam 10-n that occurs as a result of mode hop by laser diode 15 is focused by lens 23 at a point on the surface 56 of sensor array 55 that is separate from the point where zero order beam 10-0 is focused. That is, in the event of a mode hop in which the excursion temperature $\Delta T$ of the laser diode spans a mode hop temperature ($Th_1$, $Th_2$, etc. in FIG. 2), the beam 10-n which is shifted to a different wavelength (i.e. $Wn_1$ to $Wn_2$, $Wn_2$ to $Wn_3$, etc), impinges on the surface 56 of array 55 at a different point. The output of array 55 is coupled by line 60 to a comparator circuit 65 which compares the current beam wavelength detected by array 55 with a pre-selected desired beam wavelength and outputs a control signal in response thereto to a suitable temperature control element 70.

Temperature control element 70 which may, for example, comprise a Peltier or thermoelectric heater/cooler placed in heat exchange relation with laser diode 15, regulates operating temperatures of diode 15. The controller 71 for temperature control element 70 is coupled to the output of a comparator circuit 65 by line 72, controller 71 responding to the signal output of comparator circuit 65 to either heat or cool the diode 15 to maintain the diode low in the non-mode hop operating region.

In order to maintain diode laser 15 in a temperature region in which mode hops do not occur, comparator circuit 65 must perform several functions. First, circuit 65 must determine or map the wavelength or photodiode positions at which mode hops (as shown in FIG. 2) occur during the start-up of the machine. This involves making a machine setup cycle in which a uniform temperature excursion of for example from 10° to 20° C. from ambient is made while noting the wavelengths at which large excursions of the beam 10-0 on the photodiodes of array 55 occur. Circuit 65 then chooses the largest temperature region between mode hops and thereafter controls laser diode temperature to stay within the chosen range.

These functions can be enabled with a relatively simple analog or digital circuit of the type shown and described in copending application "Apparatus And Method for Detecting And Eliminating Diode Laser Mode Hopping", Ser. No. 882,123, filed on July 3, 1986 in the name of Joseph J. Daniele and assigned to the present assignee, said copending application being incorporated by reference herein.

The FIG. 3 type of system for controlling laser diode temperatures to prevent mode hopping may be classified generally as a feedback system in which the output beam is monitored for evidence of mode hopping. When mode hopping is detected, the temperature control element 70 is actuated to adjust the temperature of laser diode 15 to bring the diode temperature within the temperature excursion range $\Delta T$ where no mode hopping occurs. At this point, mode hopping is terminated. However, the response time is relatively slow, being of the order of approximately 1 sec., and it would be advantageous if mode hopping could be prevented or inhibited from happening in the first place.

Temperature variations of the diode laser junction are due to power dissipation variations resulting from both the bias and modulation components of the driving current to the diode. The bias component of the current normally controls the extinction level (usually in the range of spontaneous emission) of the laser diode energy output, while the modulation component of the current controls the information content of the energy output. The difference between these two components controls the temperature excursion range of the laser diode junction (due to the difference in the power dissipated in the junction in the form of thermal energy). It has been found that fast (i.e. 1 microsec.) heating and/or cooling of the diode laser junction can be brought about by fast (i.e. 1 microsec.) changes in the drive or bias currents of the laser.

For example, with the laser diode on a temperature stabilized base held constant through external temperature control, a mode hopping laser may be quickly stabilized to a single mode by adjusting the bias or modulation currents to change the junction operating temperature. Sometimes an increase in current will work faster than a decrease and vice versa depending on whether the laser diode junction temperature is above or below the mode hopping temperature region $T_h$. While adjusting the temperature setpoint for the stabilized base of the laser diode will carry the junction temperature excursion range $\Delta t$ into a region where mode hopping does not occur (as discussed earlier), this approach is as noted relatively slow (i.e., approx. 1 sec.). However, adjustment of the temperature setpoint permits setting the bias and modulation current parameters so as to optimize energy output from the laser diode while operating in a non-mode hopping region.

In the present invention, the temperature limits that result from the bias and modulation currents are set so as to control the energy output of the diode to retain diode operation in a non-mode hopping region. In this context, it will be understood that attempts to control diode mode hopping through control of diode current and/or temperature assume that the laser diode junction wavelength versus temperature characteristic contains a stable region of temperature excursion $\Delta T$ where adjusting of the bias and modulation currents may be employed without intruding into a mode hopping temperature region $T_h$. Further, it will be understood that the stable excursion temperature range $\Delta T$ will be dependent on the laser diode junction characteristic, the desired current parameters, and the heat sink base temperature.

Referring now to FIG. 4 of the drawings, the upper and lower limits of a desired stable temperature excursion $\Delta T$ are identified. For this, the bias current on diode 15 is decreased which in turn decreases the low end of the temperature excursion $\Delta T$. It is noted in this respect that while the temperature excursion $\Delta T$ may increase, the average temperature and lowest bias temperature will nevertheless be reduced. If the decrease in diode temperatures causes the diode to enter a region of unstable operation, mode hopping will commence and thus the bias current ($C_{bl}$) at that point will identify the lower end of a stable temperature excursion range $\Delta T$. The lowest bias current $Cbl$ is suitably stored.

Similarly, by increasing the modulation current of the laser diode, the modulation current at which mode hopping occurs at the upper end of the stable temperature excursion range $\Delta T$ may be determined. The highest modulation current ($C_{mh}$) is suitably stored. Therefore, by varying the bias and modulation currents of the laser diode and observing diode output for mode hopping, the currents at which mode hopping occurs may be determined for the temperature excursion range $\Delta T$ within which it is desired that the diode 15 operate.

Referring to FIG. 5 of the drawings, where like numerals refer to like parts, a suitable current sensor 80 is provided to sense diode bias and modulation current levels in the line 18 to laser diode 15. The bias level signal (BIAS) and the modulation level signal (MOD) outputs of current sensor 80 are fed to one input of bias and modulation current comparators 83, 84 respectively. A predetermined reference signal representing the previously determined lowest bias current ($C_{bl}$) at which mode hopping occurs is placed on a second input of bias current comparator 83 while a predetermined reference signal representing the previously determined highest modulator current ($C_{mh}$) at which mode hopping occurs is placed on a second input of modulation current comparator 84. The outputs of comparators 83, 84 are coupled by lines 87, 88, respectively to the heat and cool control inputs of controller 71 of temperature control element 70.

OPERATION

Where a rise in the modulation peak current above the present high modulation current $C_{mh}$ (where mode hopping in the temperature excursion range $\Delta T$ within which laser diode 15 occurs) is sensed by current sensor 80, comparator 84 outputs a predetermined actuating signal to controller 71 of temperature control element 70. Controller 71 responds by actuating temperature control element 70 in the cooling mode to reduce the laser diode temperatures. Where a drop in the bias current below the preset low bias current $C_{bl}$ (where mode hopping in the temperature excursion range $\Delta T$ within which the laser diode is operating occurs) is sensed by current sensor 80, comparator 83 outputs a predetermined actuating signal to controller 71 of temperature control element 70. Controller 71 responds by actuating the temperature control element to raise diode temperatures.

Preferably, to compensate for any thermal lag, the bias and modulation current levels ($C_{bl}$ and $C_{mh}$) used are slightly higher and lower respectively than the bias and current levels at which mode hopping has been found to occur.

By using both the control system of FIGS. 3 and 4–5 together, one may offset the relatively slow response time (i.e. approximately 1 sec.) attending the feedback system of FIG. 3 by using the relatively faster (i.e. approximately 1 microsec.) response provided by the control system of FIGS. 4–5 in which the diode bias and modulation currents are monitored. As a result, the need to use a temperature sensor is avoided. At the same time, by utilizing the relatively fast response that a change in bias or modulation current provides, the time period when information is not being transferred (that is, during the period between the end of scan to the start of scan) may be used to sense the state of the laser diode junction.

Should mode hopping nevertheless occur due, for example, to abrupt changes in laser diode bias and/or modulation currents, or due to other factors that result in a change in diode temperatures, the control system of FIG. 3 will detect the resulting mode hop and actuate temperature control element 70 in the manner described.

While the invention has been described with reference to the structure disclosed, it is not confined to the details set forth, but is intended to cover such modifications or changes as may come within the scope of the following claims.

We claim:
1. A method of preventing laser diode mode hopping comprising the steps of:
    (a) identifying a stable operating temperature range for said laser diode by
        (1) reducing diode biasing current until a predetermined biasing current is reached providing a first diode temperature level at which said laser diode mode hops, and
        (2) increasing diode modulating current until a predetermined modulating current is reached providing a second diode temperature level at which said laser diode mode hops;
    (b) monitoring said diode biasing and modulating currents when operating said diode;
    (c) heating said diode in response to detection of said predetermined diode biasing current to raise said diode temperature and prevent said diode from reaching said first temperature level whereby to prevent said diode from mode hopping; and
    (d) cooling said diode in response to detection of said predetermined diode modulating current to lower said diode temperature and prevent said diode from reaching said second temperature level whereby to prevent said diode from mode hopping.

2. A method for detecting and preventing mode hopping of a laser diode which is scanned across a recording member by a rotating holographic disc having a series of beam defraction gratings which intercept the beam output by said diode and scan the beam across the recording member, the diode having biasing and image signal modulating current inputs for operating said diode to expose said recording member and form the image represented by the image signal content of said modulating current on said member, comprising the steps of:
    (a) monitoring said diode biasing and modulating currents when operating said diode;
    (b) heating said diode in response to a predetermined diode biasing current whereby to raise said diode temperature and prevent said diode temperature from dropping into a diode mode hopping region; and
    (c) cooling said diode in response to a predetermined diode modulating current whereby to lower said diode temperature and prevent said diode temperature from dropping into a diode mode hopping region.

3. The method according to claim 2 including the step of:
    identifying said predetermined diode biasing and modulating currents which produce a stable non-mode hopping operating temperature range for said diode by
        (1) reducing said diode biasing current until a first low diode temperature is reached at which said laser diode enters said mode hopping region,
        (2) increasing said diode modulating current until a second high diode temperature is reached at which said laser diode enters said mode hopping region.

4. Apparatus for detecting and preventing laser diode mode hopping in a printer of the type having a recording member on which images to be printed are formed through image-wise exposure, said recording member being movable in a first scanning direction, the laser diode having a driving current input composed of diode biasing and image forming modulating currents, the light from the laser diode beam exposing said member in accordance with the image content of said modulating current, a rotatable holographic disc having a succession of defraction gratings, said disc being disposed relative to said laser diode so that the beam emitted by said laser diode impinges on said gratings in succession as said disc rotates to thereby scan the beam across said recording member in a second scanning direction, comprising in combination:
  (a) a temperature control element in heat exchange relation with said diode, said temperature control element being selectively actuatable to either heat or cool said diode;
  (b) current sensing means for monitoring said biasing and modulating currents to said diode, said current sensing means responding on a predetermined bias current to actuate said temperature control element to raise diode temperature and prevent diode mode hopping, said current sensing means responding to a predetermined modulating current to actuate said temperature control element to lower diode temperature and prevent diode mode hopping.

5. Apparatus according to claim 4 including optical means to detect mode hopping induced displacement of said laser diode beam, and control means responsive to detection of displacement of said laser diode beam by said optical means for adjusting diode temperatures to terminate laser diode mode hopping and displacement of said laser diode beam.

* * * * *